(12) United States Patent
Igarashi et al.

(10) Patent No.: US 10,061,036 B2
(45) Date of Patent: Aug. 28, 2018

(54) RADIATION DETECTOR, METHOD OF MANUFACTURING RADIATION DETECTOR, AND IMAGING APPARATUS

(71) Applicant: SONY CORPORATION, Tokyo (JP)

(72) Inventors: Takahiro Igarashi, Kanagawa (JP); Yusuke Oyama, Kanagawa (JP); Shusaku Yanagawa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/547,650

(22) PCT Filed: Jan. 8, 2016

(86) PCT No.: PCT/JP2016/050540
§ 371 (c)(1),
(2) Date: Jul. 31, 2017

(87) PCT Pub. No.: WO2016/132764
PCT Pub. Date: Aug. 25, 2016

(65) Prior Publication Data
US 2018/0003830 A1   Jan. 4, 2018

(30) Foreign Application Priority Data
Feb. 19, 2015 (JP) ................. 2015-030442

(51) Int. Cl.
*G01T 1/20* (2006.01)
*H01L 27/146* (2006.01)

(52) U.S. Cl.
CPC ...... *G01T 1/2018* (2013.01); *H01L 27/14623* (2013.01); *H01L 27/14663* (2013.01); *H01L 27/14685* (2013.01); *H01L 27/14689* (2013.01)

(58) Field of Classification Search
CPC .... G01T 1/2018; G21K 4/00; G21K 2004/04; H01L 27/14632; H01L 27/14663;
(Continued)

(56) References Cited

U.S. PATENT DOCUMENTS

| 5,171,996 A | 12/1992 | Perez-Mendez |
| 2008/0245968 A1* | 10/2008 | Tredwell ............... G01T 1/2018 250/370.09 |

(Continued)

FOREIGN PATENT DOCUMENTS

| CA | 2114539 A | 2/1993 |
| CN | 103988306 A | 8/2014 |

(Continued)

OTHER PUBLICATIONS

International Search Report and Written Opinion of PCT Application No. PCT/JP2016/050540, dated Feb. 23, 2016, 05 pages of English Translation and 13 pages of ISRWO.

*Primary Examiner* — Kiho Kim
(74) *Attorney, Agent, or Firm* — Chip Law Group

(57) ABSTRACT

A radiation detector includes a substrate, a plurality of device sections each disposed separately from the substrate and each including a photoelectric conversion device, a buried layer formed in a region between the device sections, and a wavelength conversion layer that is formed on the plurality of device sections and converts entered radiation into light. Any of the device sections includes a first surface that faces the wavelength conversion layer, and a second surface that faces the substrate, and an upper end of the buried layer is disposed at a position higher than the second surface of the any of the device sections.

16 Claims, 13 Drawing Sheets

(58) Field of Classification Search
CPC ........... H01L 27/1464; H01L 27/14636; H01L 27/14689; H01L 27/14685
See application file for complete search history.

(56) References Cited

U.S. PATENT DOCUMENTS

2014/0326892 A1    11/2014  Ootorii et al.
2016/0322411 A1*  11/2016  Elen ................. H01L 27/14623

FOREIGN PATENT DOCUMENTS

| | | | |
|---|---|---|---|
| EP | 597943 | A | 5/1994 |
| JP | 07-500454 | A | 1/1995 |
| JP | 09-325185 | A | 12/1997 |
| JP | 2001-128064 | A | 5/2001 |
| JP | 2006-052982 | A | 2/2006 |
| JP | 2013-124976 | A | 6/2013 |
| JP | 2015-064332 | A | 4/2015 |
| KR | 10-2014-0113638 | A | 9/2014 |
| TW | 201330303 | A | 7/2013 |
| TW | 201510558 | A | 3/2015 |
| WO | 1993/003496 | A1 | 7/1992 |
| WO | 2013/089209 | A2 | 12/2012 |
| WO | 2015/029389 | A1 | 8/2014 |

* cited by examiner

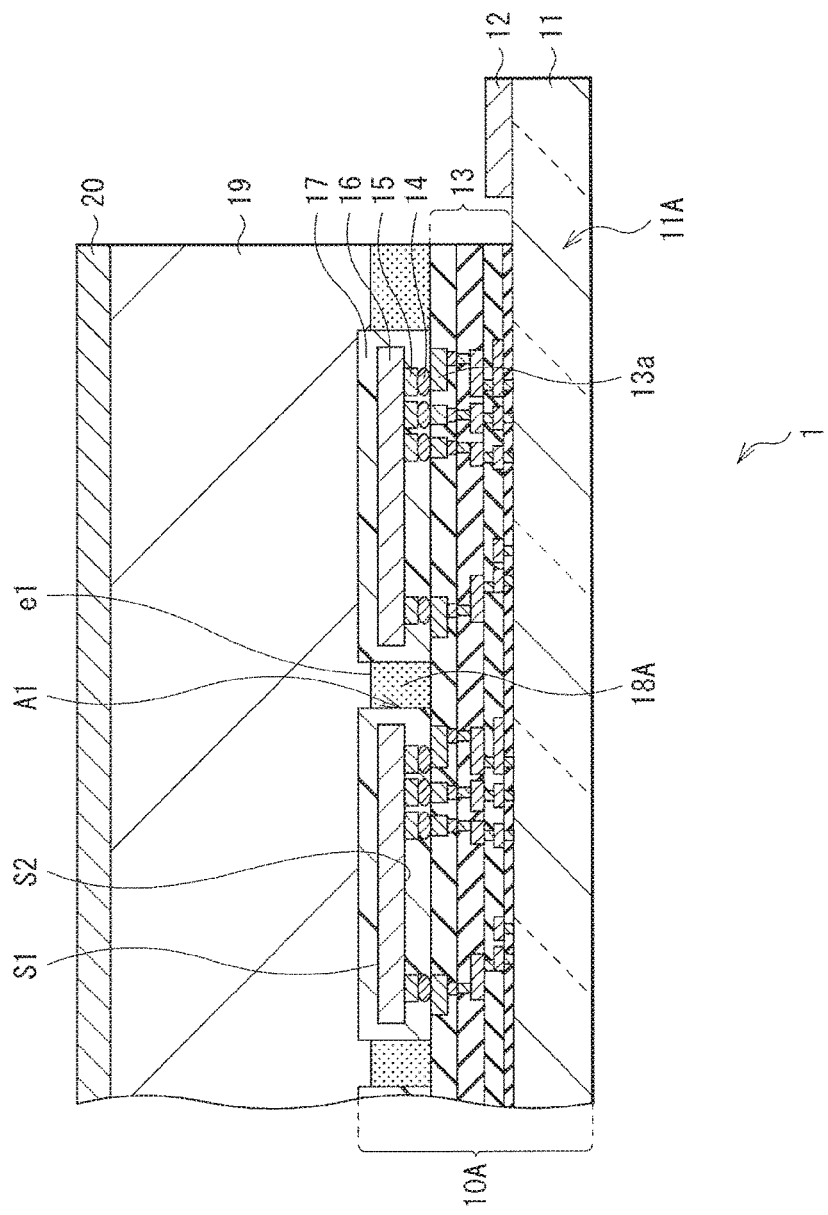
[FIG. 1]

[ FIG. 2 ]
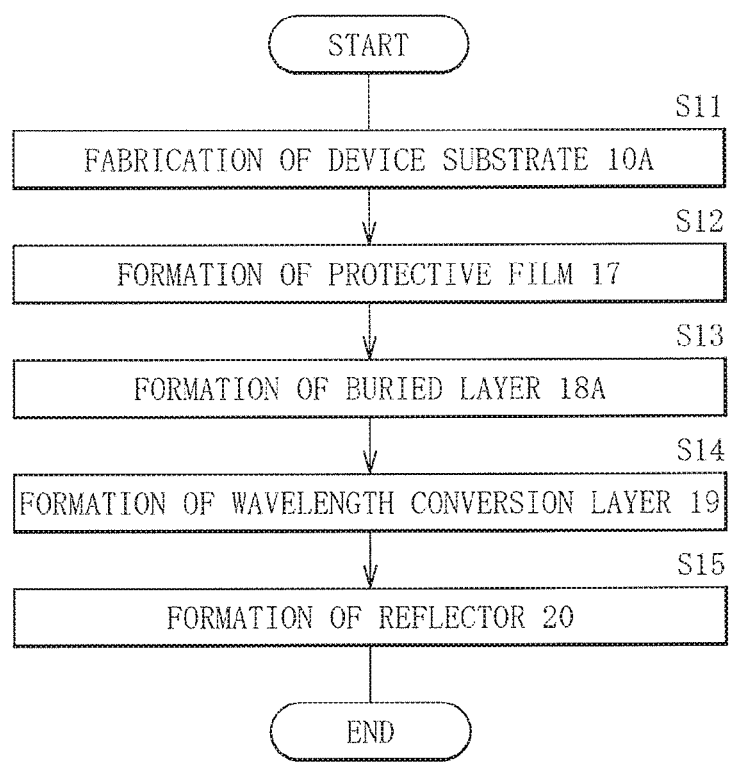

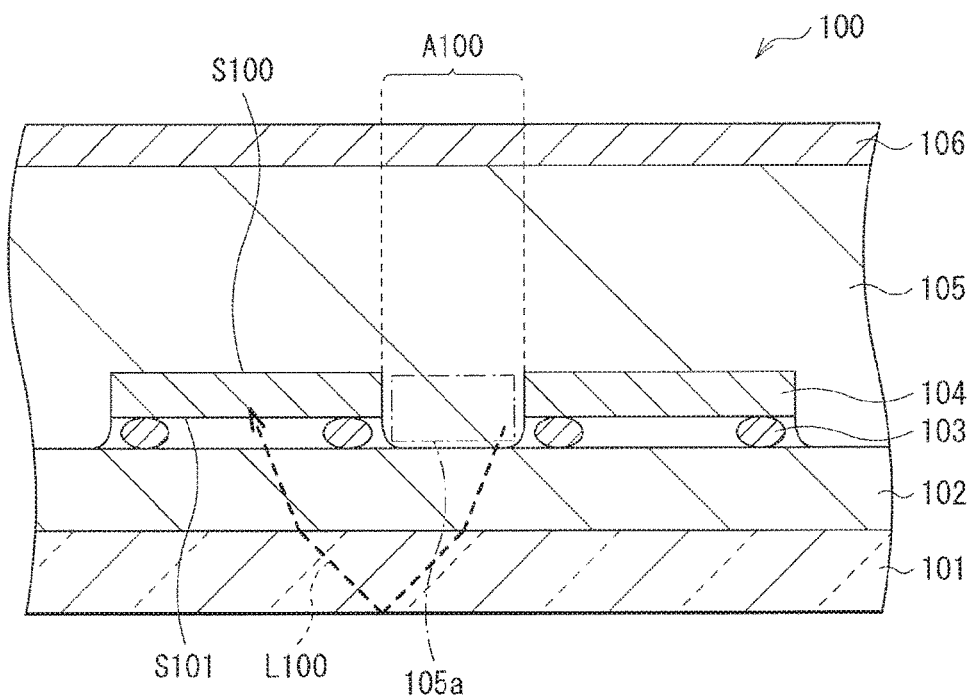
[FIG. 3]

[ FIG. 4 ]
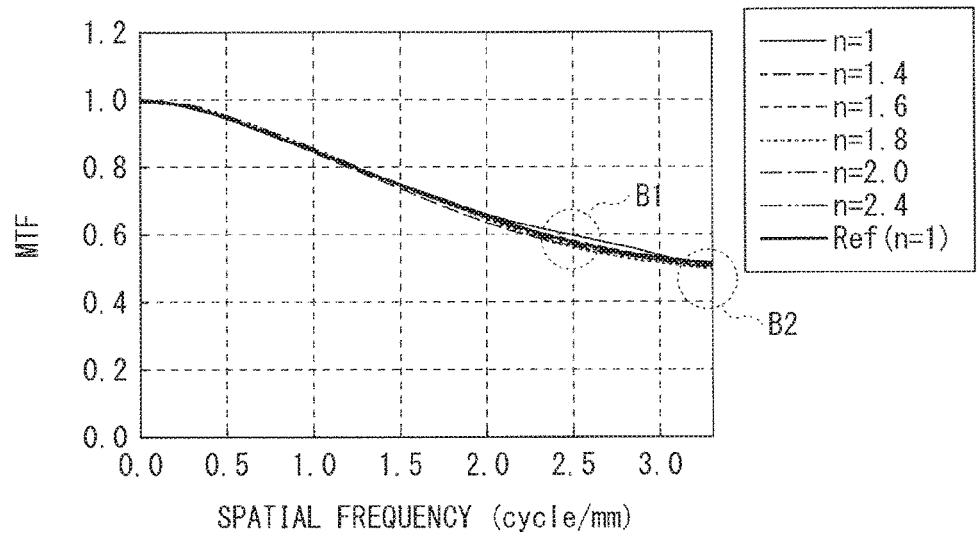
[ FIG. 5 ]
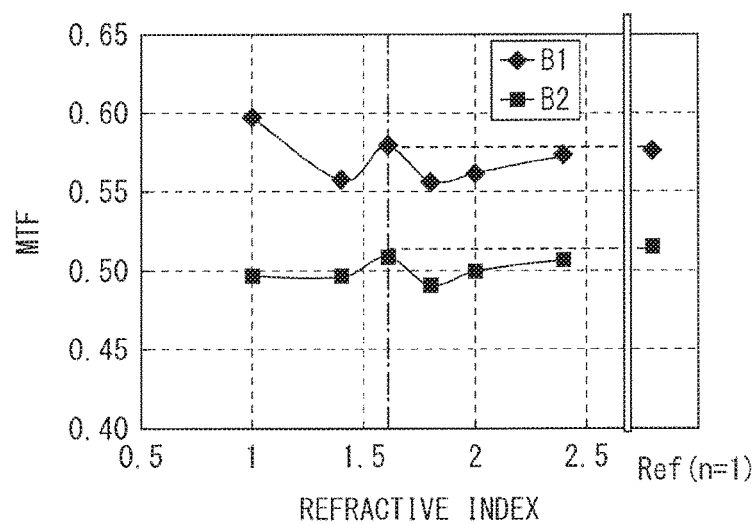

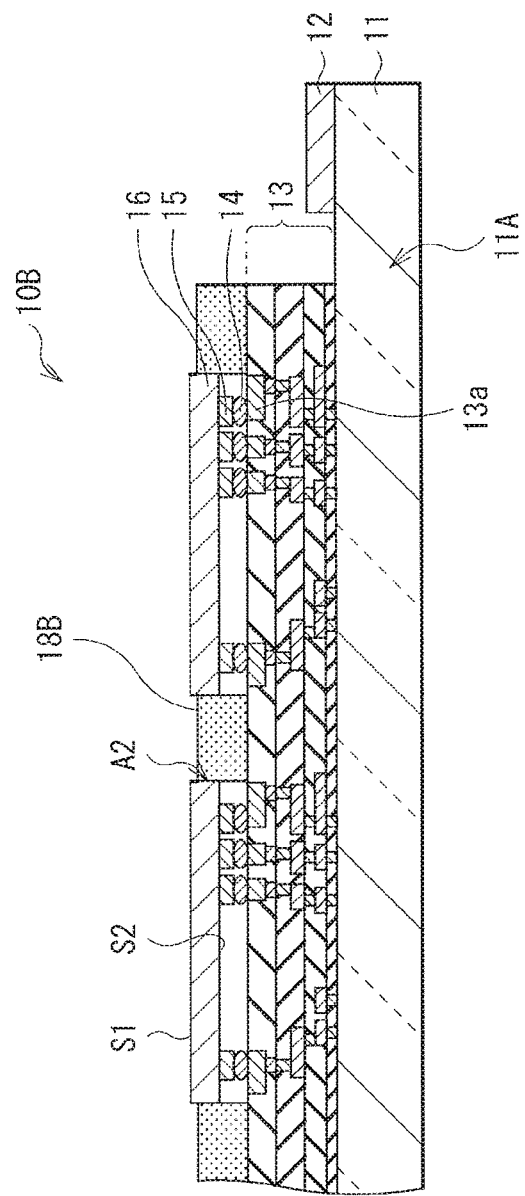
[FIG. 6]

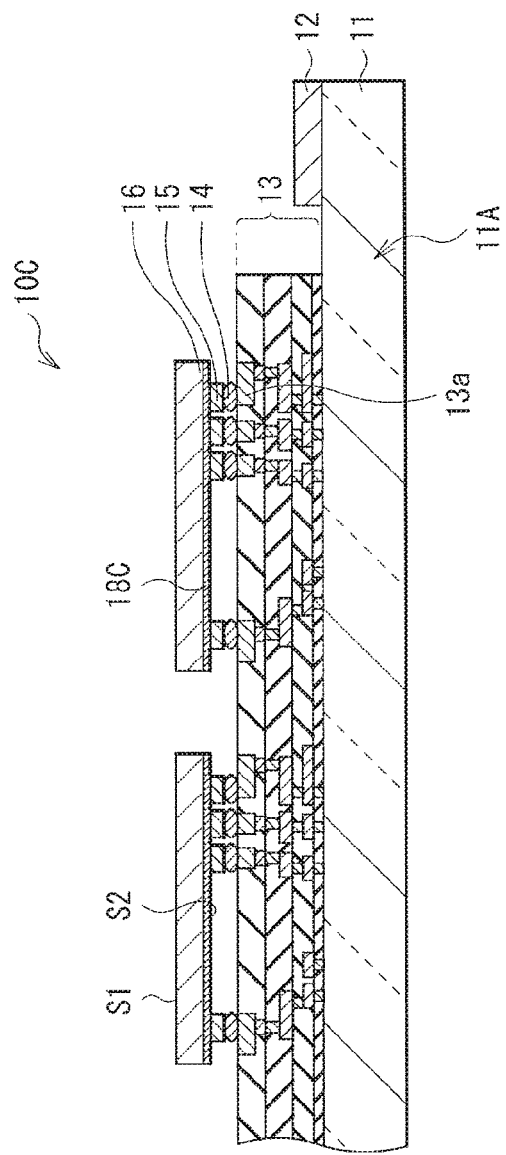
[FIG. 7]

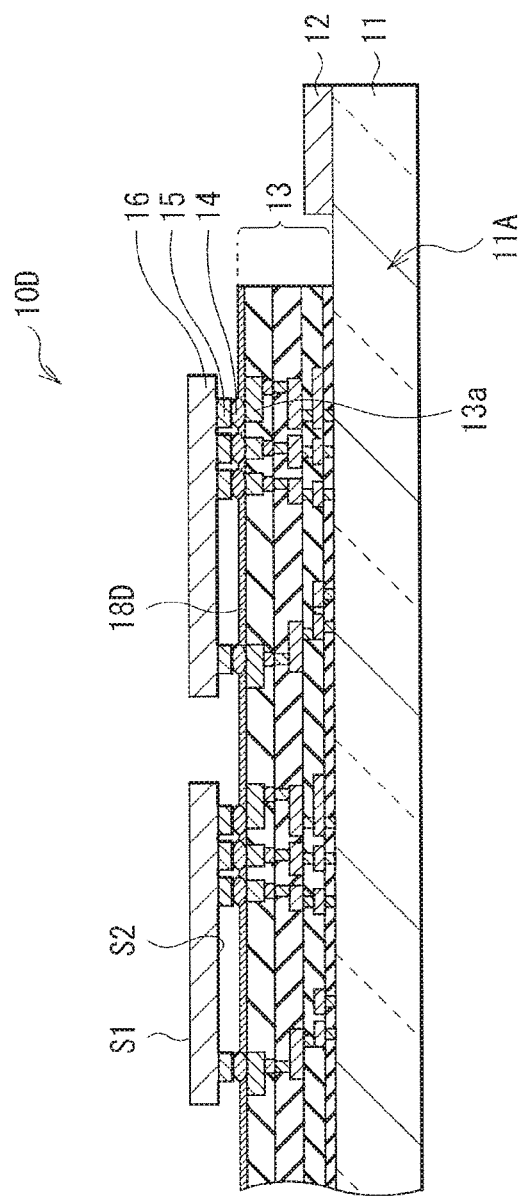
[FIG. 8]

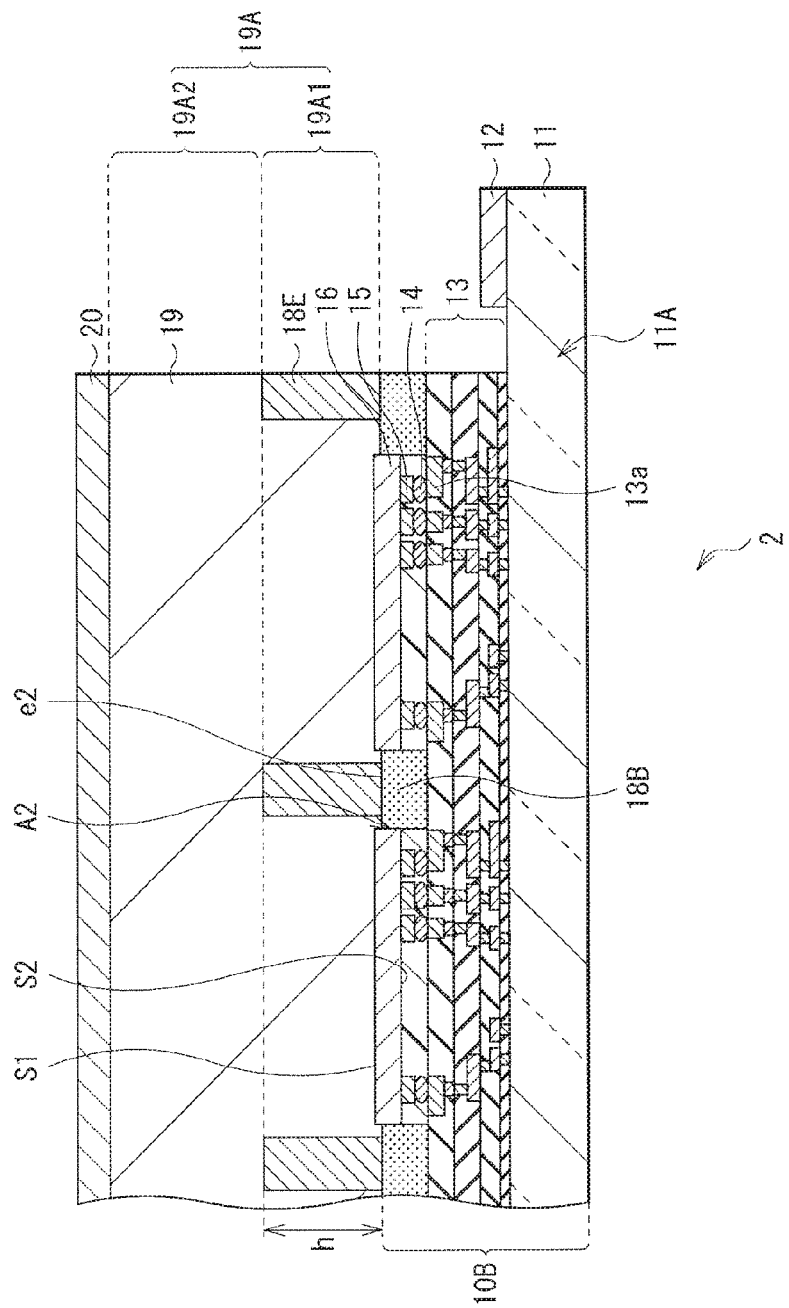
[FIG. 9]

[ FIG. 10 ]
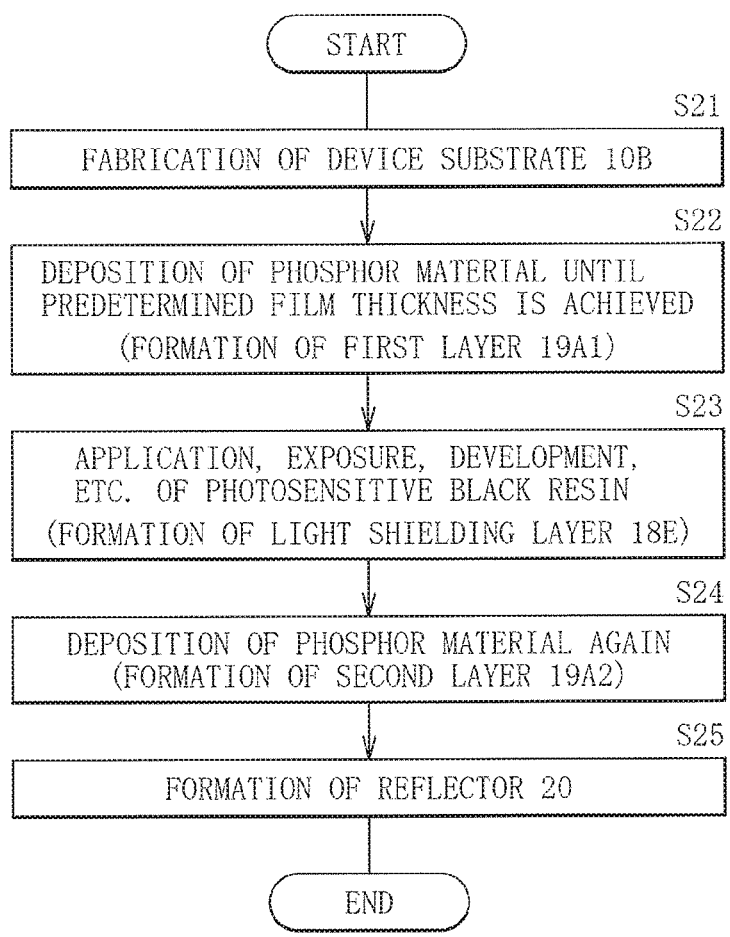

[ FIG. 11 ]
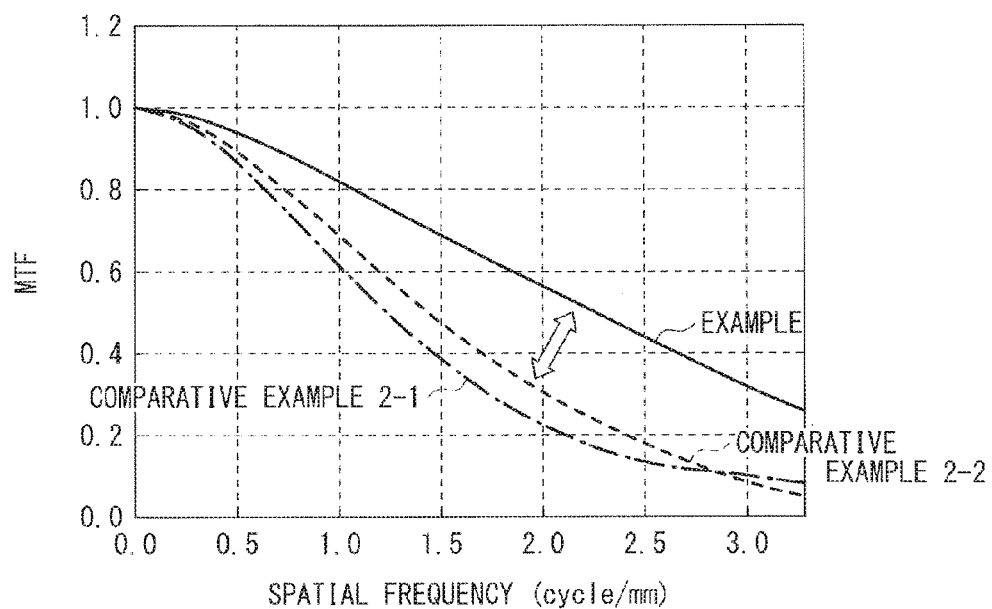
[ FIG. 12 ]
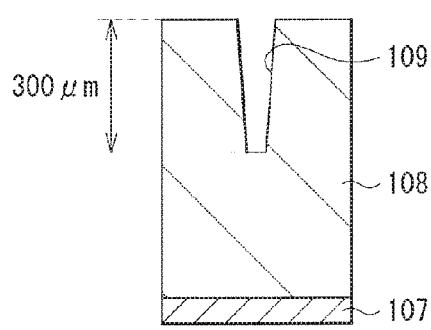

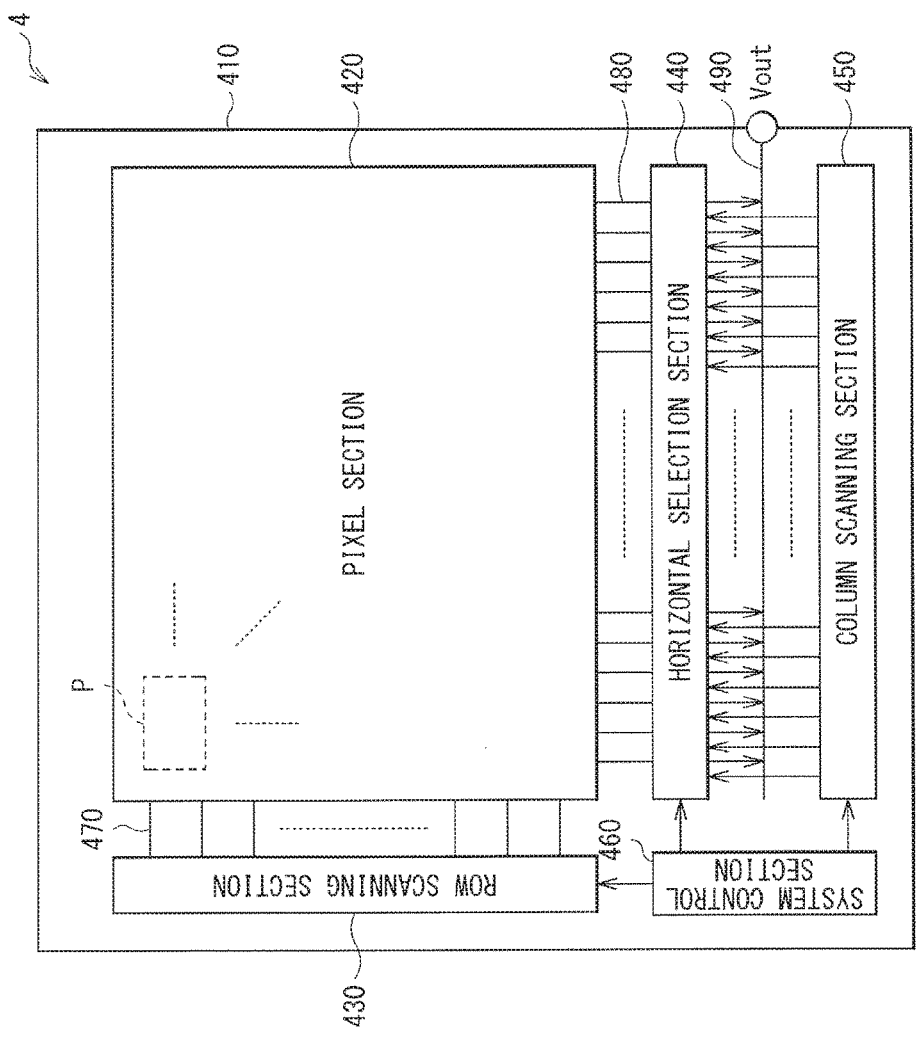
[FIG. 13]

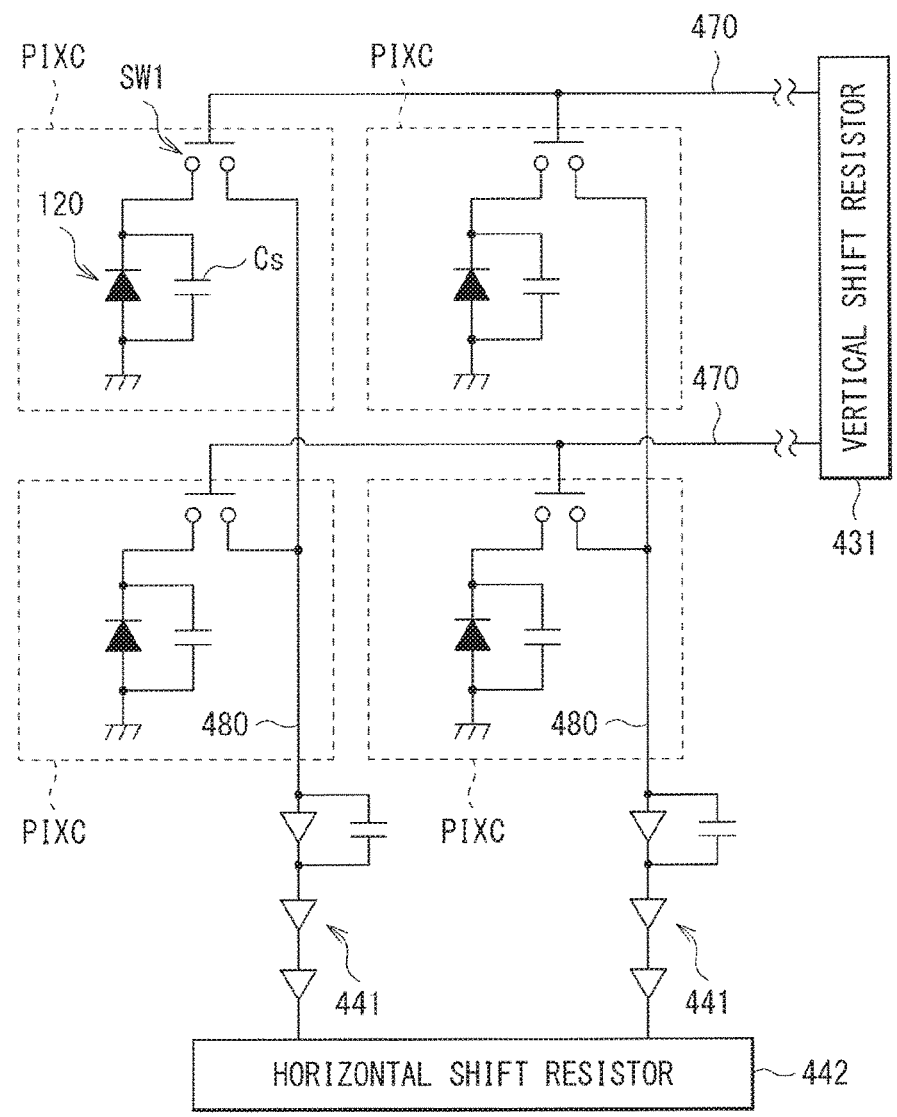
[FIG. 14]

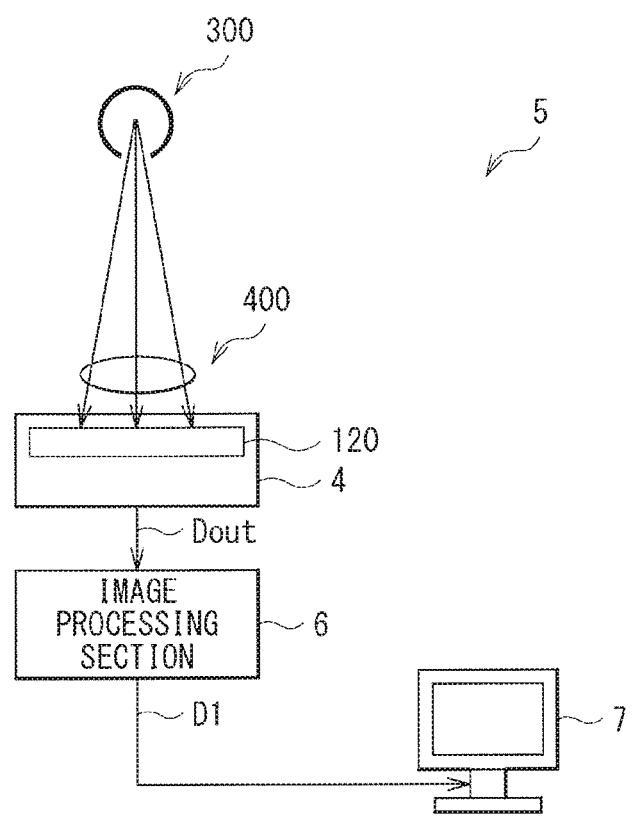
[FIG. 15]

RADIATION DETECTOR, METHOD OF MANUFACTURING RADIATION DETECTOR, AND IMAGING APPARATUS

CROSS REFERENCE TO RELATED APPLICATIONS

This application is a U.S. National Phase of International Patent Application No. PCT/JP2016/050540 filed on Jan. 8, 2016, which claims priority benefit of Japanese Patent Application No. JP 2015-030442 filed in the Japan Patent Office on Feb. 19, 2015. Each of the above-referenced applications is hereby incorporated herein by reference in its entirety.

TECHNICAL FIELD

The disclosure relates to a radiation detector that detects radiations such as α-rays, β-rays, γ-rays, and X-rays and a method of manufacturing the radiation detector. Further, the disclosure relates to an imaging apparatus including the above-described radiation detector.

BACKGROUND ART

Various kinds of imaging apparatuses in which a photoelectric conversion device is included in each pixel (each imaging pixel) have been proposed. Examples of such imaging apparatuses include a radiation imaging apparatus such as a flat panel detector (FPD) (for example, PTL 1).

CITATION LIST

Patent Literature

PTL 1: Japanese Unexamined Patent Application Publication No. 2006-52982

SUMMARY OF INVENTION

In the above-described FPD, for example, a modulation transfer function (MTF) is used as an index representing resolution. Proposal of a radiation detector that makes it possible to enhance the MTF and to achieve high image quality is desired.

Accordingly, it is desirable to provide a radiation detector that makes it possible to achieve high image quality, a method of manufacturing the radiation detector, and an imaging apparatus that includes such a radiation detector.

A first radiation detector according to an embodiment of the disclosure includes: a substrate; a plurality of device sections each disposed separately from the substrate and each including a photoelectric conversion device; a buried layer formed in a region between the device sections; and a wavelength conversion layer that is formed on the plurality of device sections and converts entered radiation into light. Any of the device sections includes a first surface that faces the wavelength conversion layer, and a second surface that faces the substrate, and an upper end of the buried layer is disposed at a position higher than the second surface of the any of the device sections.

A second radiation detector according to an embodiment of the disclosure includes: a substrate; a plurality of device sections each disposed separately from the substrate and each including a photoelectric conversion device; and a wavelength conversion layer that is formed on the plurality of device sections and converts entered radiation into light. Any of the device sections includes a first surface that faces the wavelength conversion layer, and a second surface that faces the substrate, and a light shielding film is formed on the second surface of the any of the device sections or a surface of the substrate.

A third radiation detector according to an embodiment of the disclosure includes: a substrate; a plurality of device sections each disposed separately from the substrate and each including a photoelectric conversion device; and a wavelength conversion layer that is formed on the plurality of device sections and converts entered radiation into light. The wavelength conversion layer includes a first layer divided for each of the device sections, and a second layer formed on the first layer and common to the plurality of device sections.

An imaging apparatus according to an embodiment of the disclosure includes the above-described first radiation imaging apparatus according to the embodiment of the disclosure.

A method of manufacturing a radiation detector according to an embodiment of the disclosure includes: forming a plurality of device sections on a substrate, in which each of the device sections is disposed separately from the substrate and includes a photoelectric conversion device; and forming a wavelength conversion layer on the device sections, in which the wavelength conversion layer converts entered radiation into light. The wavelength conversion layer includes a first layer divided for each of the device sections, and a second layer formed on the first layer and common to the plurality of device sections.

In the first radiation detector and the imaging apparatus according to the respective embodiments of the disclosure, the plurality of device sections are disposed separately from the substrate, and the buried layer is formed in the region between the device sections. This suppresses dropping of a wavelength conversion material in the region between the device sections. Further, the upper end of the buried layer is disposed at the position higher than the second surface of any of the device sections, which suppresses a portion of light emitted from the wavelength conversion layer as stray light from coming around and reaching a location between the device sections and the substrate.

In the second radiation detector according to the embodiment of the disclosure, the plurality of device sections are disposed separately from the substrate, and the light shielding film is formed on the second surface of any of the device sections. This suppresses entering of light to the second surface of any of the device sections even in a case where a portion of light emitted from the wavelength conversion layer becomes stray light and the stray light has come around and reached a location between the device sections and the substrate. Alternatively, the light shielding film is formed on the surface of the substrate. This suppresses light reflection that occurs at the surface of the substrate, which suppresses occurrence of light that travels toward the second surface even in the case where the portion of the light emitted from the wavelength conversion layer becomes the stray light and the stray light has come around and reached the location between the device sections and the substrate.

In the third radiation detector according to the embodiment of the disclosure, the plurality of device sections are disposed separately from the substrate, and the wavelength conversion layer includes the first layer that is divided for each of the device sections, and the second layer that is formed on the first layer and is common to the plurality of device sections. This suppresses leakage of light that travels to the adjacent device section as compared with a case where the wavelength conversion layer is not divided or a case where upper side (on the radiation entering side) of the wavelength conversion layer is divided.

In the method of manufacturing the radiation detector according to the embodiment of the disclosure, the plurality of device sections are formed separately from the substrate, and the wavelength conversion layer is thereafter formed on the plurality of device sections. The wavelength conversion layer includes the first layer that is divided for each of the device sections, and the second layer that is formed on the first layer and is common to the plurality of device sections. This suppresses leakage of light that travels to the adjacent device section as compared with a case where the wavelength conversion layer is not divided or a case where only upper side of the wavelength conversion layer is divided.

According to the first radiation detector and the imaging apparatus of the respective embodiments of the disclosure, the plurality of device sections are disposed separately from the substrate, and the buried layer is formed in the region between the device sections. In addition, the upper end of the buried layer is disposed at the position higher than the second surface of any of the device sections. This makes it possible to suppress the stray light from entering the second surface of any of the device sections, and to suppress deterioration of the MTF. Accordingly, it is possible to achieve high image quality.

According to the second radiation detector of the embodiment of the disclosure, the plurality of device sections are disposed separately from the substrate, and the light shielding film is formed on the second surface of any of the device sections or the surface of the substrate. This makes it possible to suppress the stray light from entering the second surface of any of the device sections, and to suppress deterioration of the MTF. Accordingly, it is possible to achieve high image quality.

According to the third radiation detector of the embodiment of the disclosure, the plurality of device sections are disposed separately from the substrate, and the wavelength conversion layer includes the first layer that is divided for each of the device sections, and the second layer that is formed on the first layer and is common to the plurality of device sections. This makes it possible to suppress the leakage of light that travels to the adjacent device section, and to enhance the MTF. Accordingly, it is possible to achieve high image quality.

According to the method of manufacturing the radiation detector of the embodiment of the disclosure, the plurality of device sections are formed separately from the substrate, and the wavelength conversion layer is thereafter formed. The wavelength conversion layer includes the first layer that is divided for each of the device sections, and the second layer that is formed on the first layer and is common to the plurality of device sections. This makes it possible to suppress the leakage of light that travels to the adjacent device section, and to suppress deterioration of the MTF. Accordingly, it is possible to achieve high image quality.

Note that the above-described contents are examples of the disclosure. The effects of the disclosure are not limited to the above-described effects. Effects achieved by the disclosure may be effects other than those described above or may further include other effects.

BRIEF DESCRIPTION OF DRAWINGS

FIG. 1 is a diagram illustrating an example of a cross-sectional configuration of a radiation detector according to a first embodiment of the disclosure.

FIG. 2 is a flowchart illustrating a method of manufacturing the radiation detector in FIG. 1.

FIG. 3 is a cross-sectional schematic diagram to describe workings of a radiation detector according to a comparative example.

FIG. 4 is a characteristic diagram illustrating a relationship between a spatial frequency of a material used for a buried layer illustrated in FIG. 1 and MTF.

FIG. 5 is a characteristic diagram illustrating a relationship between a refractive index of the material used for the buried layer illustrated in FIG. 1 and the MTF.

FIG. 6 is a diagram illustrating an example of a cross-sectional configuration of a device substrate of a radiation detector according to a modification of the first embodiment of the disclosure.

FIG. 7 is a diagram illustrating a cross-sectional configuration of a device substrate of a radiation detector according to a second embodiment of the disclosure.

FIG. 8 is a diagram illustrating an example of a cross-sectional configuration of a device substrate of a radiation detector according to a modification of the second embodiment of the disclosure.

FIG. 9 is a diagram illustrating an example of a cross-sectional configuration of a radiation detector according to a third embodiment of the disclosure.

FIG. 10 is a flowchart illustrating a method of manufacturing the radiation detector in FIG. 9.

FIG. 11 is a characteristic diagram illustrating MTFs in Example and comparative examples 2-1 and 2-2.

FIG. 12 is a schematic diagram to explain a configuration of a device used in the comparative example 2-2 in FIG. 11.

FIG. 13 is a diagram illustrating an example of an entire configuration of an imaging apparatus according to a fourth embodiment of the disclosure.

FIG. 14 is a diagram illustrating an example of a schematic configuration of a pixel circuit.

FIG. 15 is a diagram illustrating an example of a schematic configuration of an imaging display system according to an application example.

DESCRIPTION OF EMBODIMENTS

Some embodiments of the invention are described in detail below with reference to drawings. Note that description is given in the following order.
1. First embodiment (an example of a radiation detector in which a chip-shaped device section is covered with a protective film and a buried layer is provided in a region between the device sections)
2. Modification 1 (an example in a case where a buried layer is colored)
3. Second embodiment (an example of a radiation detector in which a light shielding film is provided on a second surface of the device section)
4. Modification 2 (an example of a radiation detector in which a light shielding film is provided on a surface of a wiring substrate)
5. Third embodiment (an example of a radiation detector including a wavelength conversion layer that includes a first layer divided for each device section and a second layer common to device sections)
6. Fourth embodiment (an imaging apparatus)
7. Application example (an imaging display system)

<First Embodiment>
[Configuration]
FIG. 1 is a diagram illustrating an example of a cross-sectional configuration of a radiation detector (a radiation detector 1) according to a first embodiment of the disclosure. The radiation detector 1 detects radiations such as α-rays, β-rays, γ-rays, and X-rays, and is a radiation detector of an indirect conversion system. The indirect conversion system refers to a system that converts a radiation into an optical signal, and thereafter converts the optical signal into an electric signal. The radiation detector 1 includes, for example, a wavelength conversion layer 19 and a reflector 20 on a device substrate 10A. The device substrate 10A is configured of a wiring substrate 11A (a substrate) on which a plurality of device sections 16 are mounted.

The wiring substrate 11A includes, for example, a circuit section 12 and a wiring layer 13 on a substrate 11. The substrate 11 is, for example, an insulation substrate such as a glass substrate. The substrate 11 may be a light non-transmissive substrate (a light shielding layer) such as a silicon substrate.

The circuit section 12 includes a conversion circuit, an amplifier circuit, and an A/D conversion circuit. The conversion circuit converts, into a voltage signal, a current signal outputted from each of the device sections 16. The amplifier circuit amplifies the voltage signal outputted from the conversion circuit. The A/D conversion circuit converts an analog signal outputted from the amplifier, into a digital signal. One conversion circuit is provided for one or a plurality of device sections 16. One amplifier circuit is provided for one or a plurality of device sections 16. One A/D conversion circuit is provided for one or a plurality of device sections 16. The conversion circuit, the amplifier circuit, and the A/D conversion circuit may be provided in a pixel circuit of the wiring layer 13.

The wiring layer 13 includes a plurality of pixel circuits, a plurality of pad electrodes 13a, and various kinds of wiring layers. The wiring layer 13 is configured of electroconductive layers and interlayer insulation films that are stacked in multilayers. The pixel circuit includes a drive circuit that drives the device section 16. The interlayer insulation film is made of, for example, silicon oxide ($SiO_2$) or silicon nitride ($SiN_x$). The interlayer insulation film may be a light shielding layer containing a light non-transmissive material.

The pad electrode 13a is a terminal electrode electrically coupled to the pixel circuit and is exposed on a top surface of the wiring layer 13. The pad electrode 13a is in contact with a bump 14 (described later) of the device section 16. One pixel circuit and a plurality of pad electrodes 13a are allocated to each device section 16, and for example, are disposed in each region facing the device section 16. Each of the pad electrodes 13a contains, for example, an electroconductive metal material such as under bump metallization (UBM). The UBM is made of, for example, nickel (Ni) and functions as a solder diffusion suppressing layer.

The plurality of device sections 16 are mounted on the wiring substrate 11A. For example, the plurality of device sections 16 are two-dimensionally arranged on the wiring substrate 11A. The plurality of device sections 16 are mounted on the wiring substrate 11A. Therefore, the respective device sections 16 are disposed separately from one another in a plane (in a planar view). In other words, the adjacent device sections 16 have a gap therebetween, and the gap configures a concave part (a concave part A1) in a cross-sectional view. Further, the device sections 16 are disposed separately (spatially separated) from the wiring substrate 11A. This is because the device sections 16 are coupled to the wiring substrate 11A in selective regions. More specifically, a terminal electrode (an electrode 15) of the device section 16 and the pad electrode 13a of the wiring substrate 11A are coupled through the bump 14. This forms the gap between the device sections 16 and the wiring substrate 11A, and the device sections 16 are each so mounted that a most part of the second surface S2 is floated from the surface of the wiring substrate 11A.

The electrode 15 is the terminal electrode electrically coupled to a photoelectric conversion device of the device section 16, and is disposed on the second surface S2 of the device section 16. The electrode 15 is in contact with the bump 14, and contains, for example, an electroconductive metal material such as the UBM. The bump 14 is made of, for example, an alloy containing lead or tin as a main component, and is formed by, for example, electrolytic plating or imprinting of solder paste.

The device section 16 configures, for example, one chip, and includes the photoelectric conversion device such as a photodiode. The photoelectric conversion device has a function of converting entered light into a current signal. In this case, the device section 16 has a so-called backside illumination structure, and a surface (a first surface Si) on the wavelength conversion layer 19 side serves as a light receiving surface. The device section 16, however, has light sensitivity on a surface (a second surface S2) located on the wiring substrate 11a side. The device section 16 is covered with a protective film 17.

The protective film 17 is made of, for example, an organic material or an inorganic material. Examples of the organic material include an acrylic resin, an epoxy resin, a parylene resin, a urethane resin, and a silicone resin. The protective film 17 desirably covers the first surface S1 and the second surface S2 of the device section 16. The protective film 17 may not cover a bottom surface of the concave part A1 as illustrated in FIG. 1, or may cover the bottom surface of the concave part A1 although not illustrated.

In the device substrate 10A of the present embodiment, a buried layer 18A is formed in the concave part A1 between the device sections 16 in the above-described configuration. The buried layer 18A contains, for example, a resin material. Examples of the resin material include an acrylic resin, an epoxy resin, a parylene resin, a urethane resin, and a silicone resin. The buried layer 18A desirably has a refractive index substantially the same as the refractive index of the protective film 17. For example, the same resin material (such as parylene C) may be used for the buried layer 18A and the protective film 17.

An upper end e1 of the buried layer 18A is disposed at a position higher than the second surface S2 of the device section 16. Although detail is described later, this is because disposing the upper end e1 at the position higher than the second surface S2 makes it possible to suppress deterioration of the MTF due to stray light (occurrence of stray light) that comes around and reaches a location between the second surface S2 of the device section 16 and the wiring substrate 11A. Further, as illustrated in the figure, the upper end e1 of the buried layer 18A is desirably disposed at a position lower than the first surface S1 of the device section 16. This is because, when a portion of the wavelength conversion layer 19 is divided as with a third embodiment described layer, it is possible to form a crystal interface between the device sections 16 owing to a convex shape of the device sections 16.

The wavelength conversion layer 19 converts entered radiations into light of a wavelength within a sensitivity range of the photoelectric conversion device of the device section 16. More specifically, the wavelength conversion layer 19 is configured of a phosphor (a scintillator) that converts radiations such as α-rays, β-rays, γ-rays, and X-rays into visible light. Examples of such a phosphor include cesium iodide (CsI) added with thallium (Tl) or sodium (Na), and sodium iodide (NaI) added with thallium (Tl). In addition, examples of the above-described phosphor include cesium bromide (CsBr) added with europium (Eu), and cesium fluoridebromide (CsBrF) added with europium (Eu).

The wavelength conversion layer 19 is formed through, for example, a vacuum deposition method, on the top surface of the device substrate 10A as a crystal growth surface.

The reflector 20 has a function of returning, toward the device sections 16, the light that has been emitted from the wavelength conversion layer 19 toward a direction opposite to the device sections 16. The reflector 20 may be made of a moisture impermeable material that does not substantially transmit moisture. In this case, the reflector 20 makes it possible to prevent moisture from entering the wavelength conversion layer 19. The reflector 20 is configured of, for example, a thin plate glass. The reflector 20 may not be provided. The reflective structure provided on the wavelength conversion layer 19 may have a configuration other than the above-described reflector 20, and may be made of, for example, a deposition film of A1.

[Manufacturing Method]

The radiation detector 1 as described above is manufactured in the following manner, for example. FIG. 2 is a diagram illustrating a flow of manufacturing steps of the radiation detector 1.

First, the device substrate 10A is fabricated (step S11). Although the detail of a method of fabricating the device substrate 10A is omitted, for example, the plurality of device sections 16 are formed, and the electrodes 15 and the bumps 14 are thereafter formed on one surface (the second surface S2) of each of the device sections 16. Thereafter, the plurality of device sections 16 are mounted on the wiring substrate 11A. Subsequently, the bumps 14 are press-bonded by reflowing, thereby bonding the device sections 16 on the wiring substrate 11A. Thereafter, the protective films 17 are so formed as to cover the respective device sections 16 (step S12). Subsequently, the buried layer 18A is formed in the concave part A1 between the device sections 16 (step S13). It is possible to form the buried layer 18A through a method such as application and vapor deposition polymerization. It is possible to fabricate the device substrate 10A in this manner.

Subsequently, the device substrate 10A is placed in a vapor deposition apparatus, and crystal growth of the above-described phosphor material is performed through, for example, a vacuum deposition method to form the wavelength conversion layer 19 (step S14). Finally, the reflector 20 is disposed on the wavelength conversion layer 19 (step S15). Note that a structure in which the phosphor material is crystal-grown on the reflector 20 may be prepared and the structure may be disposed on the device substrate 10A. As a result, the radiation detector 1 illustrated in FIG. 1 is completed.

[Workings and Effects]

In the above-described radiation detector 1, when radiations enter the wavelength conversion layer 19, the wavelength conversion layer 19 emits light (for example, visible light). The light enters the device section 16, and is thereafter converted into an electric signal by the photoelectric conversion device. The electric signal is outputted to an external circuit for each of the device sections 16 by the pixel circuit formed in the wiring layer 13. It is possible to detect the radiations in such a manner.

Here, the plurality of device sections 16 are mounted on the wiring substrate 11A. In addition, in the radiation detector 1 according to the present embodiment, the device sections 16 are disposed separately from the wiring substrate 11A, and the gap (the concave part A1) is generated in the region between the device sections 16 as well.

FIG. 3 is a diagram illustrating a cross-sectional configuration of a radiation detector (a radiation detector 100) according to a comparative example of the present embodiment. In the radiation detector 100 according to the comparative example as illustrated in the figure, a wiring layer 102 and a plurality of device sections 104 are formed on a substrate 101 as with the present embodiment. The device sections 104 are mounted. The device sections 104 and the wiring layer 102 are bonded to each other by bumps 103. In addition, a wavelength conversion layer 105 is formed on the plurality of device sections 104, and a reflector 106 is disposed on the wavelength conversion layer 105.

In the radiation detector 100 according to the comparative example, the device sections 104 are formed separately from the wiring layer 102. In addition, a concave part (a concave part A100) configured by a gap is formed between the device sections 104. Therefore, in the comparative example, the wavelength conversion layer 105 is formed also in the concave part A100 (the wavelength conversion material is dropped into the concave part A100) in the manufacturing process. As a result, a part (105a) corresponding to the concave part A100 serves as a light passage (path) and a portion of the light emitted from the wavelength conversion layer 105 travels toward the substrate 101.

Since glass is often used for the substrate 101, the light having entered the substrate 101 propagates inside the glass and causes a phenomenon referred to as glare. In addition, in the manufacturing process of the FPD, a TFT process similar to that for a liquid crystal display is often used. Therefore, a circuit including a photodiode is formed on the glass substrate and the wavelength conversion layer is formed thereon. In such a layer structure, the light outputted from the wavelength conversion layer 105 is reflected by the substrate 101, thereby becoming stray light ($L_{100}$). In this case, the device section 104 including the photodiode has light sensitivity not only on a surface ($S_{100}$) on the wavelength conversion layer 105 side but also on a surface ($S_{101}$) on the substrate 101 side. Accordingly, the MTF is deteriorated by influence of the stray light.

In contrast, in the present embodiment, the buried layer 18A is formed in the region (the concave part A1) between the device sections 16 in the structure in which the plurality of device sections 16 are disposed separately from the wiring substrate 11A. Therefore, the wavelength conversion layer 19 is formed above the buried layer 18A, which makes it possible to suppress the dropping of the wavelength conversion material into the concave part A1. In addition, the upper end e1 of the buried layer 18A is disposed at the position higher than the second surface S2 of each of the device sections 16, which makes the portion of the light emitted from the wavelength conversion layer 19 as the stray light difficult to come around and reach the location between the wiring substrate 11A and the device sections 16. This makes it possible to suppress deterioration of the MTF and thereby to achieve high resolution. Accordingly, it is possible to achieve high image quality.

In addition, in the present embodiment, the refractive index of the buried layer 18A is desirably the same as the refractive index of the protective film 17. FIG. 4 is a diagram illustrating simulation results of the MTF characteristics to the spatial frequency in each of cases where the refractive index of the buried layer 18A is set to 1, 1.4, 1.6, 1.8, 2.0, and 2.4. Further, FIG. 5 is a diagram illustrating the MTF characteristics to the refractive index in a case where the spatial frequency is near 2.5 (cycle/mm) (B1 in FIG. 4) and in a case where the spatial frequency is near 3.5 (cycle/mm) (B2 in FIG. 4). Moreover, as a reference example (Ref (n=1)), the values of the MTF in a case where the second surface S2 does not have light sensitivity and the concave part A1 is formed as an air layer (n=1) are illustrated in FIG. 4 and at a right end in FIG. 5. Note that a parylene resin (refractive index of 1.6) was used for the protective film 17.

As illustrated in FIG. 5, a favorable result was obtained for the MTF in the case where the refractive index was 1.6. Therefore, desirably, the refractive index of the buried layer 18A is substantially the same as the refractive index of the protective film 17.

In addition, as mentioned above, the device structure that makes it possible to suppress the occurrence of stray light allows the photodiode to be mounted on a larger substrate. This makes it possible to achieve upsizing of a sensor while achieving high performance.

Next, other embodiments and modifications of the disclosure are described. In the following, components similar to those of the above-described first embodiment are denoted by the same reference numerals, and description of such components is omitted where appropriate.

<Modification 1>

FIG. 6 is a diagram illustrating a cross-sectional configuration of a device substrate (a device substrate 10B) of a radiation detector according to a modification (a modification 1) of the above-described first embodiment. The device substrate 10B of the present modification is used in a radiation detector that detects radiations such as α-rays, β-rays, γ-rays, and X-rays, as with the above-described first embodiment. In addition, although illustration is omitted in FIG. 6, the wavelength conversion layer 19 and the reflector 20 are provided on the device substrate 10B.

The device substrate 10B has a configuration in which the plurality of device sections 16 are mounted on the wiring substrate 11A (the substrate 11, the circuit layer 12, and the wiring layer 13), as with the device substrate 10A according to the above-described first embodiment. In addition, the device sections 16 are disposed separately from the wiring substrate 11A, and the device sections 16 have a gap (a concave part A2) at a region provided therebetween. Furthermore, a buried layer (a buried layer 18B) is formed in the concave part A2.

In the present modification, however, the buried layer 18B contains, for example, a resin material similar to that of the buried layer 18A according to the above-described first embodiment, and a light absorbing pigment or dye (the buried layer 18B is made of a colored resin).

As mentioned above, the buried layer 18B formed in the concave part A2 may be colored. This makes it possible to suppress the dropping of the wavelength conversion layer 19 into the concave part A2 in the manufacturing process, and to shield a portion of the light emitted from the wavelength conversion layer 19 by the buried layer 18B. Accordingly, the occurrence of the stray light is effectively suppressed and the light is difficult to come around and reach the location between the device sections 16 and the wiring substrate 11A. This makes it possible to achieve effects equivalent to or higher than the effects of the above-described first embodiment.

<Second Embodiment>

[Configuration]

FIG. 7 is a diagram illustrating a cross-sectional configuration of a device substrate (a device substrate 10C) of a radiation detector according to a second embodiment of the disclosure. The device substrate 10C according to the present embodiment is used in a radiation detector that detects radiations such as α-rays, β-rays, γ-rays, and X-rays, as with the above-described first embodiment. In addition, although illustration is omitted in FIG. 7, the wavelength conversion layer 19 and the reflector 20 are provided on the device substrate 10C.

The device substrate 10C has a configuration in which the plurality of device sections 16 are mounted on the wiring substrate 11A (the substrate 11, the circuit layer 12, and the wiring layer 13), as with the device substrate 10A according to the above-described first embodiment. In addition, the device sections 16 are disposed separately from the wiring substrate 11A, and the device sections 16 have a gap at a region provided therebetween.

In the present embodiment, however, a light shielding film (a light shielding film 18C) is formed on the second surface S2 of each of the device sections 16. In other words, the second surface S2 of the device section 16 is made lower in light sensitivity than the first surface S1. The light shielding film 18C may be made of a light reflecting material or a light absorbing material, and contains, for example, a metal, a pigment, a dye, or the like. The light shielding film 18C may be formed over the entire second surface S2 through a method such as coating, for example, before the device sections 16 are mounted on the wiring substrate 11A. Note that the light shielding film 18C according to the present embodiment corresponds to a specific but example of a "first light shielding film" of the disclosure.

As mentioned above, the light shielding film 18C may be formed on the second surface S2 of the device section 16. This suppresses entering of the light to the second surface S2 of the device section 16 even in a case where a portion of the light emitted from the wavelength conversion layer 19 becomes the stray light and the stray light has come around and reached the location between the device sections 16 and the wiring substrate 11A. This makes it possible to suppress deterioration of the MTF and thereby to achieve high resolution. Accordingly, it is possible to achieve high image quality.

<Modification 2>

FIG. 8 is a diagram illustrating a cross-sectional configuration of a device substrate (a device substrate 10D) of a radiation detector according to a modification (a modification 2) according to the above-described second embodiment. The device substrate 10D of the present modification is used in a radiation detector that detects radiations such as α-rays, β-rays, γ-rays, and X-rays, as with the above-described first and second embodiments. In addition, although illustration is omitted in FIG. 8, the wavelength conversion layer 19 and the reflector 20 are provided on the device substrate 10D.

The device substrate 10D has a configuration in which the plurality of device sections 16 are mounted on the wiring substrate 11A (the substrate 11, the circuit layer 12, and the wiring layer 13), as with the device substrate 10A according to the above-described first embodiment. In addition, the device sections 16 are disposed separately from the wiring substrate 11A, and the device sections 16 have a gap at a region provided therebetween. In the present modification, however, a light shielding film (a light shielding film 18D) is formed on a surface of the wiring substrate 11A. The light shielding film 18D contains, for example, a low-reflective metal, a light absorbing pigment, or a light absorbing dye. The light shielding film 18D may be formed on the surface of the wiring substrate 11A through a method such as coating, for example, before the device sections 16 are mounted on the wiring substrate 11A. Note that the light shielding film 18D according to the present modification corresponds to a specific example of a "second light shielding film" of the disclosure.

As mentioned above, the light shielding film 18D may be formed on the surface of the wiring substrate 11A. This suppresses light reflection that occurs at the surface of the wiring substrate 11A and suppresses entering of light to the second surface S2 of the device section 16 even in a case where a portion of the light emitted from the wavelength conversion layer 19 becomes the stray light and the stray light has come around and reached the location between the device sections 16 and the wiring substrate 11A. This makes it possible to suppress deterioration of the MTF and thereby to achieve high resolution. Accordingly, it is possible to achieve high image quality.

<Third Embodiment>
[Configuration]

FIG. 9 is a diagram illustrating a cross-sectional configuration of a radiation detector (a radiation detector 2) according to a third embodiment of the disclosure. The radiation detector 2 according to the present embodiment is a radiation detector that detects radiations such as α-rays, β-rays, γ-rays, and X-rays, as with the above-described first embodiment. Note that a configuration of the radiation detector 2 in which a wavelength conversion layer (a wavelength conversion layer 19A) is formed on the device substrate 10B according to the above-described modification 1 is described as an example; however, the wavelength conversion layer 19A according to the present embodiment is applicable to any of the device substrates of the above-described embodiment and modifications.

In the radiation detector 2 as well, the device sections 16 are disposed separately from the wiring substrate 11A, and the device sections 16 have a gap (the concave part A2) at a region provided therebetween. In addition, the colored buried layer 18B is formed in the concave part A2. The wavelength conversion layer 19A and the reflector 20 are disposed in this order on the device substrate 10B.

In the present embodiment, however, the wavelength conversion layer 19A includes a part (a first layer 19A1) divided for each of the device sections 16 and a part (a second layer 19A2) common to the device sections 16. In other words, a portion on the device substrate 10B side (the sensor side) of the wavelength conversion layer 19A is divided for each of the device sections 16 whereas a portion on the reflector 20 side (the radiation entering side) is provided commonly to the respective device sections 16. In the first layer 19A1, a light shielding layer 18E is formed (a light shielding material is buried) in a region corresponding to a location between the device sections 16. An upper end e2 of the buried layer 18B is desirably disposed at a position lower than the first surface S1 of the device section 16 as illustrated in the figure. This is because it is possible to form a crystal interface between the device sections 16 by allowing the top surfaces of the device sections 16 to serve as crystal growth surfaces. Note that the buried layer 18B may not be formed and a light shielding layer 18E may be formed on a bottom surface of the concave part A2.

A thickness of the first layer 19A1, namely, a height (a thickness) h of the light shielding layer 18E is, for example, equal to or larger than 100 μm, and more specifically, is 200 μm. In the case where the height h is set to 200 μm, it is possible to achieve both light emitting efficiency and the MTF. A thickness of the wavelength conversion layer 19A (a total thickness of the first layer 19A1 and the second layer 19A2) is, for example, 400 μm or larger and 800 μm or less. The light shielding layer 18E is made of a light reflecting material or a light absorbing material, and contains, for example, a metal, a pigment, a dye, or the like. Examples of the material of the light shielding layer 18E include a photosensitive resin containing a black pigment.

The radiation detector 2 as described above may be manufactured in the following manner, for example. FIG. 10 is a diagram illustrating a flow of manufacturing steps of the radiation detector 2.

First, the device substrate 10B is fabricated (step S21). More specifically, as with the device substrate 10A according to the above-described first embodiment, the plurality of device sections 16 are mounted on the wiring substrate 11A, and the buried layer 18B is thereafter formed in the concave part A2.

Subsequently, the device substrate 10B is placed in the vapor deposition apparatus, and crystal growth of the above-described phosphor material is performed through, for example, a vacuum deposition method to form the wavelength conversion layer 19A. At this time, in the present embodiment, first, the phosphor material is deposited until a predetermined film thickness (the height h) is achieved to form the first layer 19A1 (step S22). At this time, since the plurality of device sections 16 are disposed with the gap (the concave part A2) in between, the film formation progresses in which the top surfaces of the device sections 16 serve as the crystal growth surfaces, generating a crystal interface in the region (in the region on the buried layer 18B) between the device sections 16. Once stopping the vapor deposition at the time when the thickness has reached the above-described film thickness results in formation of the gap (an opening, or a concave part) surrounded by the crystal interface in the region (in the region on the buried layer 18B) corresponding to the location between the device sections 16. Thereafter, for example, application of the photosensitive resin colored in black is so performed as to bury the thus-formed gap, following which patterning is performed after processes such as exposure, development, and drying, to thereby form the light shielding layer 18E (step S23). As a result, the first layer 19A1 is formed.

Thereafter, the above-described phosphor material is deposited again to form the second layer 19A2 (step S24). It is possible to form the wavelength conversion layer 19A in the above-described manner. Finally, the reflector 20 is disposed on the wavelength conversion layer 19A (step S25). As a result, the radiation detector 2 illustrated in FIG. 9 is completed.

In the present embodiment, the wavelength conversion layer 19A includes the first layer 19A1 that is divided for each of the device sections 16 and the second layer 19A2 that is common to the plurality of device sections 16 in the configuration in which the plurality of device sections 16 are disposed separately from the wiring substrate 11A. In other words, the portion of the wavelength conversion layer 19A on the device sections 16 side is divided for each of the device sections 16, which makes it possible to effectively suppress leakage of light that travels to the adjacent device section 16, as compared with a case where the portion of the wavelength conversion layer is not divided or a case where a portion of the upper side of the wavelength conversion layer (on the radiation entering side) is divided.

Here, FIG. 11 is a diagram illustrating simulation results of the MTF characteristics in a case where the thickness of the first layer 19A1 of the wavelength conversion layer 19A was set to 200 μm and aluminum was used for the reflector 20, as Example. In addition, as a comparative example, characteristic results in a case where the wavelength conversion layer 19A was not divided (a comparative example 2-1) and in a case where a portion on the radiation entering side was divided (a comparative example 2-2) are also illustrated. Note that, in the comparative example 2-2, a concave part 109 was formed up to a depth of 300 μm from the top surface in a wavelength conversion layer 108 formed on a device substrate 107 as illustrated in FIG. 12. It can be appreciated from the simulation results that the MTF characteristics were improved in Example with the dividing, as compared with the comparative example 2-1 without the dividing. In addition, Example in which the portion on the device sections 16 side was divided achieved larger effects, as compared with the comparative example 2-2 in which the portion on the radiation entering side was divided.

As mentioned above, in the present embodiment, the first layer 19A1 of the wavelength conversion layer 19A is divided for each of the device sections 16, which makes it possible to suppress the leakage of light that travels to the adjacent device section 16 and to suppress the stray light. Moreover, the light shielding layer 18E is buried in the region between the device sections 16, which makes it possible to effectively suppress the leakage of light. In addition, the two-layer structure of the first layer 19A1 and the second layer 19A2 allows for the formation of the light shielding layer 18E by utilizing the gap generated as a result of the crystal interface in the first layer 19A1. The vapor deposition is performed again to form the second layer 19A2 after the formation of the light shielding layer 18E, which makes it possible to form the wavelength conversion layer 19A at a desired film thickness. Furthermore, the film quality (crystallinity of a columnar crystal) in the wavelength conversion layer 19A is better for the second layer 19A2 than for the first layer 19A1. Therefore, dividing the first layer 19A1 that is unstable in film quality, to form the light shielding layer 18E makes it possible to effectively suppress the stray light.

<Fourth Embodiment>

FIG. 13 is a diagram illustrating a schematic configuration of an imaging apparatus (an imaging apparatus 4) according to a fourth embodiment of the disclosure. The imaging apparatus 4 uses the above-described radiation detector 1 or the above-described radiation detector 2 (hereinafter, description is given with use of the radiation detector 1) in a pixel section (a pixel section 420), and is suitably used as an imaging apparatus for medical purposes and for nondestructive inspection such as baggage inspection. The imaging apparatus 4 includes, for example, the pixel section 420 on a substrate 410, and includes a driving section that drives the pixel section 420, for example, in a peripheral region of the pixel section 420. The driving section includes, for example, a row scanning section 430, a horizontal selection section 440, a column scanning section 450, and a system control section 460.

The pixel section 420 serves as an imaging area of the imaging apparatus 4. The pixel section 420 is configured of the radiation detector 1. In addition, the pixel section 420 is configured of the plurality of radiation detectors 1 that are tiled. Any of the device sections 16 of the above-described radiation detector 1 and a pixel circuit that drives the relevant device section 16 configure a unit pixel P.

In the pixel section 420, a plurality of unit pixels P are arranged in a matrix. Two pixel driving lines 470 are coupled per unit pixel P. In the pixel section 420, the plurality of pixel driving lines 470 extend in a row direction, and a plurality of vertical signal lines 480 extend in a column direction. The vertical signal line 480 transmits a driving signal to read a signal from the unit pixel P. The pixel driving lines 470 are each coupled to an output end of the row scanning section 430 and the pixel section 420. The vertical signal lines 480 are each coupled to an input end of the horizontal selection section 440 and the pixel section 420.

The row scanning section 430 is a pixel driving section that is configured of, for example, a shift resister, an address decoder, or the like, and drives each of the unit pixels P of the pixel section 420, for example, on a row basis. The signals outputted from the respective unit pixels P in the pixel row selected and scanned by the row scanning section 430 are supplied to the horizontal selection section 440 through the respective vertical signal lines 480. The horizontal selection section 440 is configured of, for example, an amplifier, a horizontal selection switch, etc., that are provided for each of the vertical signal lines 480.

The column scanning section 450 is configured of, for example, a shift resistor, an address decoder, or the like, and scans and drives the horizontal selection switches of the horizontal selection section 440 in order. The selection scanning by the column scanning section 450 causes the signals of the respective unit pixels P transmitted through the respective vertical signal lines 480 to be outputted to horizontal signal lines 490 in order, and the signals are transmitted to the outside of the substrate 410 through the horizontal signal lines 490.

The circuit part configured of the row scanning section 430, the horizontal selection section 440, the column scanning section 450, and the horizontal signal lines 490 may be formed directly on the substrate 410, or may be disposed in an external control IC. Alternatively, the circuit part may be formed on any other substrate coupled through a cable, etc.

The system control section 460 receives, for example, clock and data instructing an operation mode that are provided from the outside of the substrate 410, and outputs data such as internal information of the imaging apparatus 4. The system control section 460 further includes a timing generator that generates various kinds of timing signals, and controls the driving of the peripheral circuits such as the row scanning section 430, the horizontal selection section 440, and the column scanning section 450, on the basis of the various kinds of timing signals generated by the timing generator.

FIG. 14 is a diagram illustrating an example of a configuration of the pixel circuit (a pixel circuit PIXC). The pixel circuit PIXC includes, for example, a photoelectric conversion device 120, an address switch SW1, and a capacitance component Cs. The address switch SW1 is coupled to the pixel driving line 470, and is turned on or off by a vertical shift resistor 431 that configures a portion of the row scanning section 430. Note that an amplifier 441 and a horizontal shift resistor 442 that configure a portion of the horizontal selection section 440 are also illustrated in FIG. 14.

The address switch SW1 is switched for each pixel, which causes charges accumulated in the photoelectric conversion device 120 to be transmitted to the vertical signal line 480. The charges are converted into voltages by the amplifier 441, and the voltages are read out to the outside.

In the present embodiment, the above-described radiation detector 1 is used in the pixel section 420. This makes it possible to achieve an image with high image quality.

<Application Example>

FIG. 15 is a diagram illustrating an example of a schematic configuration of an imaging display system (an imaging display system 5) according to an application example. The imaging display system 5 includes, for example, the above-described imaging apparatus 4, an image processing section 6, and a display unit 7. The image processing section 6 performs predetermined image processing on an imaging signal Dout obtained by the imaging apparatus 4. The display unit 7 performs image display based on the imaging signal Dout obtained by the imaging apparatus 4. More specifically, the display unit 7 displays an image on the basis of the imaging signal (a display signal D1) having been subjected to the processing performed by the image processing section 6.

In the present embodiment, among radiations that have been applied from a radiation source 300 to an object 400, a component that has passed through the object 400 is detected by the imaging apparatus 4. The thus-obtained imaging signal Dout is subjected to the predetermined processing by the image processing section 6. The imaging signal (the display signal D1) having been subjected to the predetermined processing is outputted to the display unit 7, and an image corresponding to the display signal D1 is displayed on a monitor screen of the display unit 7.

Hereinbefore, although the disclosure has been described by referring to the embodiments and their modifications, the disclosure is not limited to the embodiments, etc., described above, and various modifications may be made. Note that the effects described in the present specification are illustrative. Effects achieved by the technology may be effects other than those described above or may further include other effects.

For example, the disclosure may adopt the following configurations.

(1) A radiation detector including:
a substrate;
a plurality of device sections each disposed separately from the substrate and each including a photoelectric conversion device;
a buried layer formed in a region between the device sections; and
a wavelength conversion layer that is formed on the plurality of device sections and converts entered radiation into light,
any of the device sections including
a first surface that faces the wavelength conversion layer, and
a second surface that faces the substrate, and
an upper end of the buried layer being disposed at a position higher than the second surface of the any of the device sections.

(2) The radiation detector according to (1), further including a protective film that covers each of the plurality of device sections, in which
the buried layer has a refractive index that is substantially same as a refractive index of the protective film.

(3) The radiation detector according to (2), in which the buried layer contains a resin material.

(4) The radiation detector according to (3), in which the buried layer contains a pigment or a dye.

(5) The radiation detector according to any one of (1) to (4), further including a first light shielding film formed on the second surface of the any of the device sections.

(6) The radiation detector according to (5), in which the first light shielding film contains a metal, a pigment, or a dye.

(7) The radiation detector according to any one of (1) to (6), further including a second light shielding film formed on a surface of the substrate.

(8) The radiation detector according to (7), in which the second light shielding film contains a low-reflective metal, a pigment, or a dye.

(9) The radiation detector according to any one of (1) to (8), in which the wavelength conversion layer includes:
a first layer divided for each of the device sections; and
a second layer formed on the first layer and common to the plurality of device sections.

(10) The radiation detector according to (9), in which the first layer includes a light shielding layer buried in the region between the device sections.

(11) The radiation detector according to (10), in which the light shielding layer contains a metal, a pigment, or a dye.

(12) A radiation detector including:
a substrate;
a plurality of device sections each disposed separately from the substrate and each including a photoelectric conversion device; and
a wavelength conversion layer that is formed on the plurality of device sections and converts entered radiation into light,
any of the device sections including
a first surface that faces the wavelength conversion layer, and
a second surface that faces the substrate, and
a light shielding film being formed on the second surface of the any of the device sections or a surface of the substrate.

(13) A radiation detector including:
a substrate;
a plurality of device sections each disposed separately from the substrate and each including a photoelectric conversion device; and
a wavelength conversion layer that is formed on the plurality of device sections and converts entered radiation into light,
the wavelength conversion layer including
a first layer divided for each of the device sections, and
a second layer formed on the first layer and common to the plurality of device sections.

(14) An imaging apparatus with a radiation detector and a driving section that drives the radiation detector, the radiation detector including:
a substrate;
a plurality of device sections each disposed separately from the substrate and each including a photoelectric conversion device;
a buried layer formed in a region between the device sections; and a wavelength conversion layer that is formed on the plurality of device sections and converts entered radiation into light,
any of the device sections including
a first surface that faces the wavelength conversion layer, and
a second surface that faces the substrate, and
an upper end of the buried layer being disposed at a position higher than the second surface of the any of the device sections.

(15)
A method of manufacturing a radiation detector, the method including:
forming a plurality of device sections on a substrate, each of the device sections being disposed separately from the substrate and including a photoelectric conversion device; and
forming a wavelength conversion layer on the device sections, the wavelength conversion layer converting entered radiation into light,
the wavelength conversion layer including
a first layer divided for each of the device sections, and
a second layer formed on the first layer and common to the plurality of device sections.

(16)
The method of manufacturing the radiation detector according to (15), in which the forming the wavelength conversion layer includes:
forming the first layer by depositing a wavelength conversion material on the plurality of device sections at a predetermined film thickness and thereafter burying a light shielding material in a region that corresponds to a gap between the devices; and
forming the second layer by depositing again the wavelength conversion material on the first layer.

This application is based upon and claims the benefit of priority of the Japanese Patent Application No. 2015-030442 filed with the Japan Patent Office on Feb. 19, 2015, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A radiation detector, comprising:
a substrate;
a first device section that is separated from the substrate through a bump,
wherein the first device section comprises a photoelectric conversion device;
a second device section;
a buried layer between the first device section and the second device section; and
a wavelength conversion layer on the first device section and the second device section,
wherein the wavelength conversion layer converts radiation into light,
wherein the first device section, comprises:
a first surface that faces the wavelength conversion layer, and
a second surface that faces the substrate, and
wherein a first position of an upper end of the buried layer is higher than a second position of the second surface of the first device section and lower than a third position of the first surface of the first device section.

2. The radiation detector according to claim 1, further comprising a protective film that covers the first device section and the second device section,
wherein a first refractive index of the buried layer is equal to a second refractive index of the protective film.

3. The radiation detector according to claim 2, wherein the buried layer comprises a resin material.

4. The radiation detector according to claim 3, wherein the buried layer comprises a pigment or a dye.

5. The radiation detector according to claim 1, further comprising a first light shielding film on the second surface of the first device section.

6. The radiation detector according to claim 5, wherein the first light shielding film comprises one of a metal, a pigment, or a dye.

7. The radiation detector according to claim 1, further comprising a second light shielding film on a third surface of the substrate.

8. The radiation detector according to claim 7, wherein the second light shielding film comprises one of a low-reflective metal, a pigment, or a dye.

9. The radiation detector according to claim 1, wherein the wavelength conversion layer includes:
a first layer comprising a plurality of parts,
wherein a first part of the plurality of parts corresponds to the first device section, and
wherein a second part of the plurality of parts corresponds to the second device section; and
a second layer on the first layer,
wherein the second layer corresponds to the first device section and the second device section.

10. The radiation detector according to claim 9, wherein the first layer includes a light shielding layer between the first device section and the second device section.

11. The radiation detector according to claim 10, wherein the light shielding layer comprises one of a metal, a pigment, or a dye.

12. A radiation detector, comprising:
a substrate;
a first device section that is separated from the substrate through a bump,
wherein the first device section comprises a photoelectric conversion device;
a second device section;
a buried layer between the first device section and the second device section; and
a wavelength conversion layer on the first device section and the second device section,
wherein the wavelength conversion layer converts radiation into light,
wherein the first device section, comprises:
a first surface that faces the wavelength conversion layer, and
a second surface that faces the substrate, and
a light shielding film on the second surface of the first device section or a third surface of the substrate,
wherein a first position of an upper end of the buried layer is higher than a second position of the second surface of the first device section and lower than a third position of the first surface of the first device section.

13. A radiation detector, comprising:
a substrate;
a first device section that is separated from the substrate through a bump, wherein the first device section comprises a photoelectric conversion device;
a second device section;
a buried layer between the first device section and the second device section,
   wherein a first position of an upper end of the buried layer is higher than a second position of a first surface of the first device section and lower than a third position of a second surface of the first device section; and
a wavelength conversion layer on the first device section and the second device section,
   wherein the wavelength conversion layer converts radiation into light,
   wherein the wavelength conversion layer comprises:
      a first layer that comprises a plurality of parts,
         wherein a first part of the plurality of parts corresponds to the first device section, and
         wherein a second part of the plurality of parts corresponds to the second device section; and
      a second layer on the first layer,
         wherein the second layer corresponds to the first device section and the second device section.

14. An imaging apparatus, comprising:
a radiation detector; and
a driving section configured to drive the radiation detector,
   wherein the radiation detector comprises:
      a substrate;
      a first device section that is separated from the substrate through a bump,
         wherein the first device section comprises a photoelectric conversion device;
      a second device section;
      a buried layer between the first device section and the second device section; and
      a wavelength conversion layer on the first device section and the second device section,
         wherein the wavelength conversion layer converts radiation into light,
         wherein the first device section, comprises:
            a first surface that faces the wavelength conversion layer, and
            a second surface that faces the substrate, and
         wherein a first position of an upper end of the buried layer is higher than a second position of the second surface of the first device section and lower than a third position of the first surface of the first device section.

15. A method of manufacturing a radiation detector, the method comprising:
forming a first device section on a substrate that is separated from the substrate through a bump,
   wherein the first device section comprises a photoelectric conversion device;
forming a second device section on the substrate;
forming a buried layer between the first device section and the second device section,
   wherein a first position of an upper end of the buried layer is higher than a second position of a first surface of the first device section and lower than a third position of a second surface of the first device section; and
forming a wavelength conversion layer on the first device section,
   wherein the wavelength conversion layer converts radiation into light,
   wherein the wavelength conversion layer comprises:
      a first layer that comprises a plurality of parts,
         wherein a first part of the plurality of parts corresponds to the first device section, and
         wherein a second part of the plurality of parts corresponds to the second device section; and
      a second layer on the first layer,
         wherein the second layer corresponds to the first device section and the second device section.

16. The method of manufacturing the radiation detector according to claim 15, wherein the forming the wavelength conversion layer further includes:
forming the first layer by depositing a wavelength conversion material on the first device section,
burying a light shielding material between the first device section and the second device section; and
forming the second layer by depositing the wavelength conversion material on the first layer.

* * * * *